United States Patent
Mutzig

(10) Patent No.: US 10,186,132 B2
(45) Date of Patent: Jan. 22, 2019

(54) TORNADO EMERGENCY ALERT DEVICE

(71) Applicant: Dusty Mutzig, El Reno, OK (US)

(72) Inventor: Dusty Mutzig, El Reno, OK (US)

( * ) Notice: Subject to any disclaimer, the term of this patent is extended or adjusted under 35 U.S.C. 154(b) by 0 days.

(21) Appl. No.: 15/405,579

(22) Filed: Jan. 13, 2017

(65) Prior Publication Data

US 2018/0204440 A1    Jul. 19, 2018

(51) Int. Cl.
  *G01W 1/00*  (2006.01)
  *G08B 21/10*  (2006.01)
  *H05K 5/00*  (2006.01)
  *H05K 5/02*  (2006.01)

(52) U.S. Cl.
  CPC ........... *G08B 21/10* (2013.01); *H05K 5/0017* (2013.01); *H05K 5/0217* (2013.01); *H05K 5/0247* (2013.01)

(58) Field of Classification Search
  CPC .. G08B 21/10; F21V 33/0076; H05K 5/0247; H05K 5/0017; H05K 5/0217; F21Y 2115/10; F21W 2111/00
  USPC ......... 340/601, 539.22, 539.26, 540, 539.21, 340/539.23
  See application file for complete search history.

(56) References Cited

U.S. PATENT DOCUMENTS

| | | | |
|---|---|---|---|
| 5,781,852 A | 7/1998 | Gropper | |
| 6,034,608 A | 3/2000 | Frank et al. | |
| 6,255,953 B1 | 7/2001 | Barber | |
| 6,295,001 B1 | 9/2001 | Barber | |
| 6,617,964 B1 | 9/2003 | Lamb | |
| 6,710,715 B2 | 3/2004 | Deeds | |
| 7,755,481 B2 | 7/2010 | Gayden | |
| 8,179,252 B2 | 5/2012 | Harrell | |
| D674,182 S | 1/2013 | Copeland et al. | |
| 2006/0184962 A1 | 8/2006 | Kendall et al. | |
| 2010/0245095 A1* | 9/2010 | Harrell | G01W 1/00 340/601 |

FOREIGN PATENT DOCUMENTS

WO    WO0077755    12/2000

* cited by examiner

*Primary Examiner* — Anh V La

(57) ABSTRACT

A tornado emergency alert device for alerting a user to a potential threat includes a housing that defines an interior space. A power module, a microprocessor and a receiver are coupled to the housing and are positioned in the interior space. The microprocessor is operationally coupled to the power module. The receiver is operationally coupled to the microprocessor and is configured to tune to a frequency utilized by an emergency services station. A speaker is coupled to the housing and is operationally coupled to the microprocessor. The receiver is configured to receive alert codes sent by the emergency services station and relay the alert codes to the microprocessor. The microprocessor is positioned to identify a specific alert code, sent to the siren most proximate to the housing, and to compel the speaker to emit an audible alarm, thus alerting the user to a potential threat such as a tornado.

15 Claims, 2 Drawing Sheets

TORNADO EMERGENCY ALERT DEVICE

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION (1) Field of the Invention (2) Description of Related Art Including Information Disclosed Under 37 CFR 1.97 and 1.98

The disclosure and prior art relates to alert devices and more particularly pertains to a new alert device for alerting a user to a potential threat.

BRIEF SUMMARY OF THE INVENTION

An embodiment of the disclosure meets the needs presented above by generally comprising a housing that defines an interior space. A power module, a microprocessor and a receiver are coupled to the housing and are positioned in the interior space. The microprocessor is operationally coupled to the power module. The receiver is operationally coupled to the microprocessor and is configured to tune to a frequency utilized by an emergency services station. A speaker is coupled to the housing and is operationally coupled to the microprocessor. The receiver is configured to receive alert codes sent by the emergency services station and relay the alert codes to the microprocessor. The microprocessor is positioned to identify a specific alert code, sent to the siren most proximate to the housing, and to compel the speaker to emit an audible alarm, thus alerting the user to a potential threat such as a tornado.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

Figure 1:
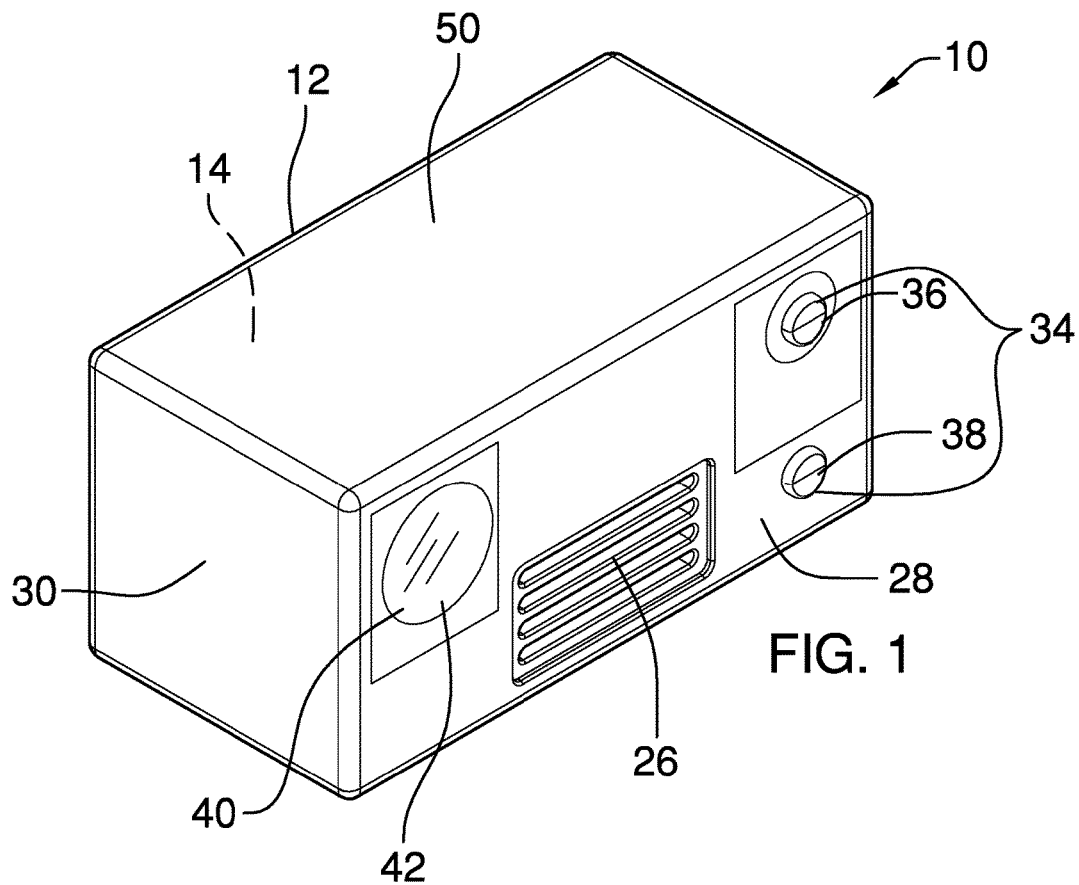
FIG. 1 is an isometric perspective view of an interior emergency alert device according to an embodiment of the disclosure.
Figure 2:
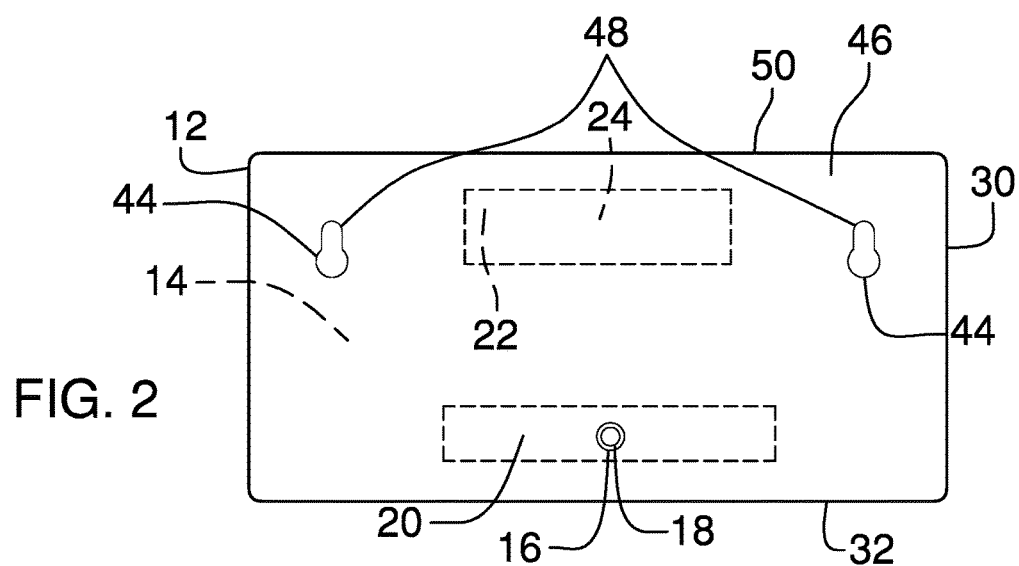
FIG. 2 is a back view of an embodiment of the disclosure.
Figure 3:
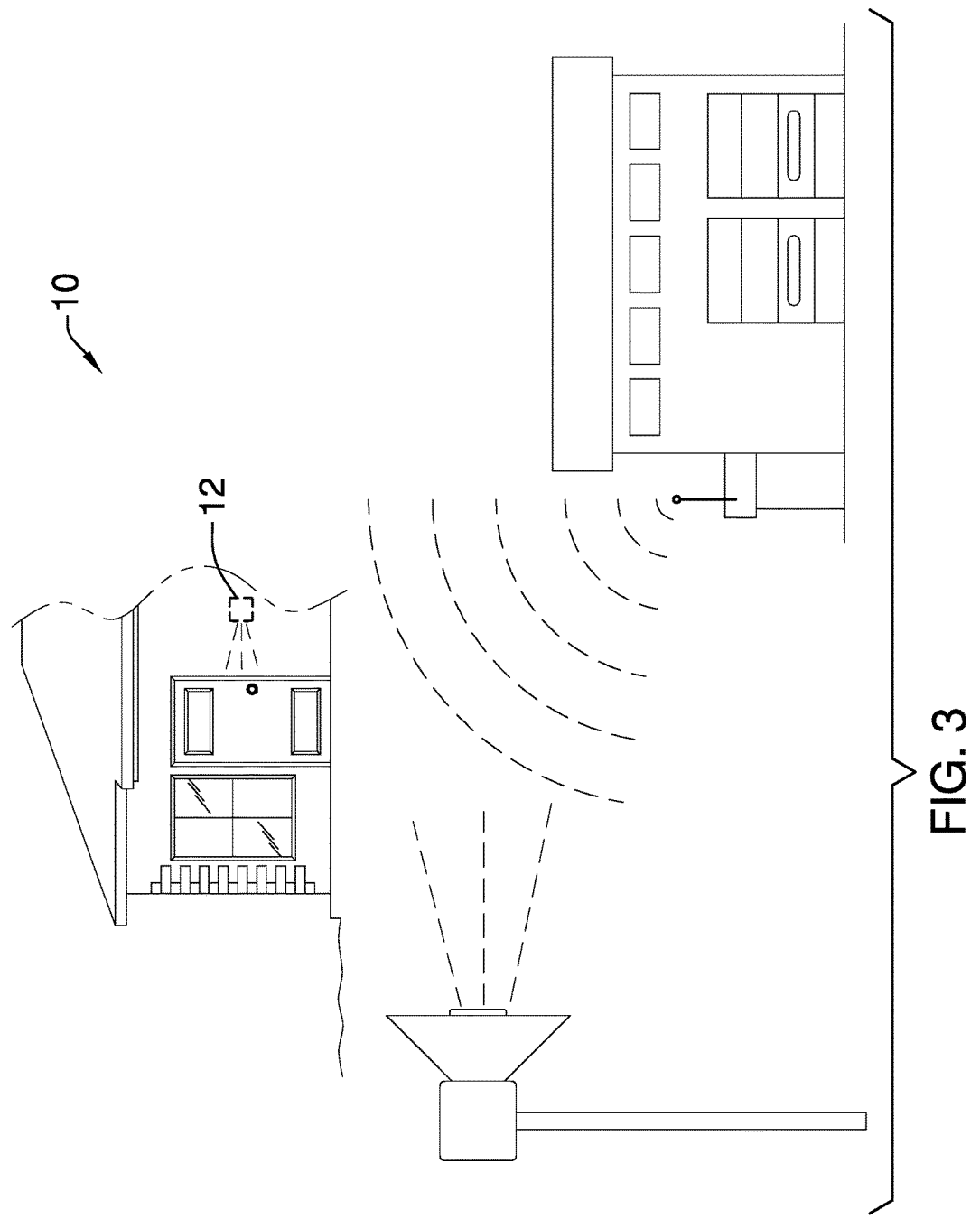
FIG. 3 is an in-use view of an embodiment of the disclosure.

With reference now to the drawings, and in particular to FIGS. 1 through 3 thereof, a new alert device embodying the principles and concepts of an embodiment of the disclosure and generally designated by the reference numeral 10 will be described.

As best illustrated in FIGS. 1 through 3, the interior emergency alert device 10 generally comprises a housing 12 that defines an interior space 14. In one embodiment, the housing 12 is substantially rectangularly box shaped.

A power module 16 is coupled to the housing 12 and is positioned in the interior space 14. In one embodiment, the power module 16 comprises a coupler 18 that is configured to couple to a source of alternating current. In another embodiment, a battery 20 is coupled to the housing 12 and is positioned in the interior space 14. The battery 20 is configured to provide current in event of a power failure.

A microprocessor 22 is coupled to the housing 12 and is positioned in the interior space 14. The microprocessor 22 is operationally coupled to the power module 16. The microprocessor 22 is configured to identify a specific alert code sent to a siren that is positioned most proximate to the housing 12.

A receiver 24 is coupled to the housing 12 and is positioned in the interior space 14. The receiver 24 is operationally coupled to the microprocessor 22. The receiver 24 is tunable. The receiver 24 is configured to tune to a frequency that is utilized by an emergency services station. The receiver 24 is configured to receive alert codes sent by the emergency services station and to relay the alert codes to the microprocessor 22. The microprocessor 22 is positioned to identify the specific code that is sent to the siren most proximate to the housing 12.

A speaker 26 is coupled to the housing 12. The speaker 26 is operationally coupled to the microprocessor 22. The microprocessor 22 is positioned to compel the speaker 26 to emit an audible alarm should the emergency services station send the specific alert code, thus alerting the user to a potential threat, such as a tornado. In one embodiment, the speaker 26 is positioned on a front 28 of the housing 12 substantially equally distant from opposing sides 30 of the housing 12. In another embodiment, the speaker 26 is positioned proximate to a bottom 32 of the housing 12.

A controller 34 is coupled to the housing 12. The controller 34 is operationally coupled to the microprocessor 22.

The controller 34 is configured to compel the microprocessor 22 to set the receiver 24 to the frequency utilized by the emergency services station. The controller 34 also is configured to input into the microprocessor 22 the specific alert code to the siren that is positioned most proximate to the housing 12. In one embodiment, the controller 34 is positioned on the front 28 of the housing 12. In another embodiment, the controller 34 comprises a first knob 36 and a second knob 38. The first knob 36 is configured to select the frequency that is utilized by the emergency services station. The second knob 38 is configured to input into the microprocessor 22 the alert code to the siren that is positioned most proximate to the housing 12.

A light 40 is coupled to the housing 12. The light 40 is operationally coupled to the microprocessor 22. The microprocessor 22 is positioned to compel the light 40 to emit a visual alarm should the emergency services station send the specific alert code, thus alerting the user to the potential threat. In one embodiment, the light 40 is positioned on the front 28 of the housing 12 proximate to a respective opposing side 30 of the housing 12. In another embodiment, the light 40 comprises at least one light emitting diode 42.

A fastener 44 is coupled to a back 46 of the housing 12. The fastener 44 is configured to couple to a vertical surface, such as a wall, to couple the housing 12 to the vertical surface. In one embodiment, the fastener 44 comprises a pair of penetrations 48 that is positioned through the back 46 of the housing 12. Each penetration 48 is positioned proximate to a top 50 of the housing 12 and a respective opposing side 30 of the housing 12.

The present invention also anticipates the receiver 24 being enabled for wireless communication, such as Bluetooth™. Programming code that is positioned on an electronic device of the user would identify the location in which the housing 12 is positioned, as well as the frequency utilized by the emergency services station and the specific alert code sent to the siren most proximate to the housing 12. The electronic device then would be positioned to wirelessly communicate the frequency utilized by the emergency services station and the specific alert code to the receiver 24. The receiver 24 would relay the frequency utilized by the emergency services station and the specific alert code to the microprocessor 22.

In use, the first knob 36 is configured to select the frequency that is utilized by the emergency services station. The microprocessor 22 is compelled to set the receiver 24 to the frequency utilized by the emergency services station. The second knob 38 is configured to input into the microprocessor 22 the alert code to the siren that is positioned most proximate to the housing 12. The receiver 24 is configured to receive the alert codes sent by the emergency services station and relay the alert codes to the microprocessor 22. The microprocessor 22 is positioned to identify the specific alert code sent to the siren most proximate to the housing 12. The microprocessor 22 is positioned to compel the speaker 26 to emit an audible alarm should the emergency services station send the specific alert code. The microprocessor 22 also is positioned to compel the light 40 to emit a visual alarm should the emergency services station send the specific alert code, thus alerting the user to a potential threat, such as a tornado.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. An interior emergency alert device configured for supplementing a siren of an emergency services station positioned most proximate to the device, the device comprising:
   a housing defining an interior space;
   a power module coupled to said housing and positioned in said interior space;
   a microprocessor coupled to said housing and positioned in said interior space, said microprocessor being operationally coupled to said power module, said microprocessor being configured for identifying an alert code for the siren of the emergency services station positioned most proximate to said housing;
   a receiver coupled to said housing and positioned in said interior space, said receiver being operationally coupled to said microprocessor, said receiver being tunable;
   a speaker coupled to said housing, said speaker being operationally coupled to said microprocessor; and
   wherein said receiver is positioned in said housing such that said receiver is configured for tuning to a frequency utilized by the emergency services station, such that said receiver is configured for receiving alert codes sent by the emergency services station and relaying the alert codes to said microprocessor, wherein said microprocessor is positioned for identifying a specific alert code for the siren most proximate to said housing, wherein said speaker is positioned on said housing such that said microprocessor is positioned to activate said speaker to emit an audible alarm should the emergency services station send the specific alert code, thus alerting the user to a potential threat.

2. The device of claim 1, further including said housing being substantially rectangularly box shaped.

3. The device of claim 1, further including said power module comprising a coupler configured for coupling to a source of alternating current.

4. The device of claim 1, further including a battery coupled to said housing and positioned in said interior space, wherein said battery is positioned in said housing such that said battery is configured for providing current in event of a power failure.

5. The device of claim 1, further including said speaker being positioned on a front of said housing substantially equally distant from opposing sides of said housing.

6. The device of claim 1, further including said speaker being positioned proximate to a bottom of said housing.

7. The device of claim 1, further including a controller coupled to said housing, said controller being operationally coupled to said microprocessor, said controller being configured for activating said microprocessor to set said receiver to the frequency utilized by the emergency services station, said controller being configured for inputting into said microprocessor the alert code for the siren positioned most proximate to said housing, wherein said controller is positioned on said housing such that said controller is configured for activating said microprocessor to set said receiver to the frequency utilized by the emergency services station and for inputting into said microprocessor the specific alert code for the siren positioned most proximate to said housing.

8. The device of claim 7, further including said controller being positioned on said front of said housing.

9. The device of claim 7, further including said controller comprising a first knob and a second knob, said first knob being configured for selecting the frequency utilized by the emergency services station, said second knob being configured for inputting into said microprocessor the specific alert code for the siren positioned most proximate to said housing.

10. The device of claim 1, further including a light coupled to said housing, said light being operationally coupled to said microprocessor, wherein said light is positioned on said housing such that said microprocessor is positioned to activate said light to emit a visual alarm.

11. The device of claim 10, further including said light being positioned on said front of said housing proximate to a respective said opposing side of said housing.

12. The device of claim 10, further including said light comprising at least one light emitting diode.

13. The device of claim 1, further including a fastener coupled to a back of said housing, said fastener being configured for coupling said housing to a vertical surface.

14. The device of claim 13, further including said fastener comprising a pair of penetrations positioned through said back of said housing, each said penetration being positioned proximate to a top of said housing and a respective said opposing side of said housing.

15. An interior emergency alert device configured for supplementing a siren of an emergency services station positioned most proximate to the device, the device comprising:
- a housing defining an interior space, said housing being substantially rectangularly box shaped;
- a power module coupled to said housing and positioned in said interior space, said power module, said power module comprising a coupler configured for coupling to a source of alternating current;
- a battery coupled to said housing and positioned in said interior space, wherein said battery is positioned in said housing such that said battery is configured for providing current in event of a power failure;
- a microprocessor coupled to said housing and positioned in said interior space, said microprocessor being operationally coupled to said power module, said microprocessor being configured for identifying a specific alert code for the siren of the emergency services station positioned most proximate to said housing;
- a receiver coupled to said housing and positioned in said interior space, said receiver being operationally coupled to said microprocessor, said receiver being tunable, wherein said receiver is positioned in said housing such that said receiver is configured for tuning to a frequency utilized by the emergency services station positioned most proximate to said housing such that said receiver is configured for receiving alert codes sent by the emergency services station and relaying the alert codes to said microprocessor, wherein said microprocessor is positioned for identifying the specific code for the siren most proximate to said housing;
- a speaker coupled to said housing, said speaker being operationally coupled to said microprocessor, wherein said speaker is positioned on said housing such that said microprocessor is positioned to activate said speaker to emit an audible alarm should the emergency services station send the specific alert code, thus alerting the user to a potential threat, said speaker being positioned on a front of said housing substantially equally distant from opposing sides of said housing, said speaker being positioned proximate to a bottom of said housing;
- a controller coupled to said housing, said controller being operationally coupled to said microprocessor, said controller being configured for activating said microprocessor to set said receiver to the frequency utilized by the emergency services station, said controller being configured for inputting into said microprocessor the specific alert code for the siren positioned most proximate to said housing, wherein said controller is positioned on said housing such that said controller is configured for activating said microprocessor to set said receiver to the frequency utilized by the emergency services station and for inputting into said microprocessor the specific alert code for the siren positioned most proximate to said housing, said controller being positioned on said front of said housing, said controller comprising a first knob and a second knob, said first knob being configured for selecting the frequency utilized by the emergency services station, said second knob being configured for inputting into said microprocessor the alert code for the siren positioned most proximate to said housing;
- a light coupled to said housing, said light being operationally coupled to said microprocessor, wherein said light is positioned on said housing such that said microprocessor is positioned to activate said light to emit a visual alarm should the emergency services station send the specific alert code, thus alerting the user to the potential threat, said light being positioned on said front of said housing proximate to a respective said opposing side of said housing, said light comprising at least one light emitting diode;
- a fastener coupled to a back of said housing, said fastener being configured for coupling said housing to a vertical surface, said fastener comprising a pair of penetrations positioned through said back of said housing, each said penetration being positioned proximate to a top of said housing and a respective said opposing side of said housing; and
- wherein said first knob is configured for selecting the frequency utilized by the emergency services station such that said microprocessor is compelled to set said receiver to the frequency utilized by the emergency services station, wherein said second knob is configured for inputting into said microprocessor the alert code for the siren positioned most proximate to said housing, such that said receiver is configured for receiving the alert codes sent by the emergency services station and relaying the alert codes to said microprocessor, wherein said microprocessor is positioned for identifying the specific alert code for the siren most proximate to said housing, wherein said speaker is positioned on said housing such that said microprocessor is positioned to compel said speaker to emit an audible alarm should the emergency services station send the specific alert code, wherein said light is positioned on said housing such that said microprocessor is positioned to activate said light to emit a visual alarm should the emergency services station send the specific alert code, thus alerting the user to a potential threat.

* * * * *